(12) United States Patent
Compton

(10) Patent No.: US 6,838,955 B1
(45) Date of Patent: Jan. 4, 2005

(54) DATA PROCESSING DEVICE (75) Inventor: Peter M. Compton, Beaverton, OR (US)

(73) Assignee: Hub Technologies, Inc., Atlanta, GA (US)

( * ) Notice: Subject to any disclaimer, the term of this patent is extended or adjusted under 35 U.S.C. 154(b) by 302 days.

(21) Appl. No.: 08/648,142

(22) Filed: Aug. 23, 1996

(51) Int. Cl.[7] .............................. H01P 5/12; H01R 9/09
(52) U.S. Cl. ...................... 333/125; 333/127; 333/128; 375/377; 439/581
(58) Field of Search ................................ 333/124, 125, 333/127, 128, 103, 104; 375/377; 439/581

(56) References Cited

U.S. PATENT DOCUMENTS

| | | | | |
|---|---|---|---|---|
| 2,428,831 A | * | 10/1947 | Brown et al. ............... | 333/127 |
| 4,254,386 A | * | 3/1981 | Nemit et al. ................ | 333/128 |
| 4,371,845 A | * | 2/1983 | Pitzalis, Jr. ............. | 333/128 X |
| 4,375,622 A | * | 3/1983 | Hollingsworth et al. | 333/127 X |
| 4,505,689 A | * | 3/1985 | Mazziotti ................ | 333/128 X |
| 4,647,879 A | * | 3/1987 | Vaddiparty .............. | 333/128 X |

* cited by examiner

Primary Examiner—Barbara Summons
(74) Attorney, Agent, or Firm—Jack E. Day

(57) ABSTRACT

The invention relates to methods and structures for connecting circuits and circuit elements processing electrical signals having very fast transition times, including sub-nanosecond transition times. It includes a connecting structure for connecting a multiplicity of signal lines at a common point to reduce unwanted reflections thereat; a single or multi-conductor female connector for receiving thin elements such as ribbon cable ends, printed circuit (PC) board edges, and the like; a structure for connecting together a multiplicity of ribbon cables terminating in such multi-conductor female connectors, and a further structure for connecting together a multiplicity of such multi-cable connectors to obtain maximum packing thereof, and minimum conductor lengths thereto, to obtain processing rates up to twenty-fold over what is available with present connecting methods and structures.

10 Claims, 5 Drawing Sheets

FIG. 3BIII

DATA PROCESSING DEVICE

In general, the invention is a method including a structure, and further structures for connecting electrical elements, for shortening the physical and electrical distances between adjacent electronic elements which process electrical signals having very fast transition times, including sub-nanosecond transition times.

In particular, when a multiplicity of signal lines having similar characteristic impedances are connected at a common connection and a signal having said fast transition times is introduced on one of said lines, the structure of the present invention significantly reduces unwanted reflections of said signal on the balance of said lines at said common connection. Also included in the present invention is a connector structure, and a novel arrangement of a multiplicity of said connector structures, for shortening the physical and electrical distances between adjacent printed circuit (hereinafter "PC") boards mounting integrated circuit (hereinafter "IC") chips. Further, it includes a connector for connecting flexible ribbon connector cables between such boards, and for a novel arrangement of a multiplicity of connectors to increase processing rates for said sub-nanosecond electrical signals.

BACKGROUND OF THE PRESENT INVENTION

In modern electronic systems such as computers and other data handling devices, processing rate (the inverse of time to add, subtract, multiply, divide, etc., two numbers) is of great importance. Processing rate is inversely proportional to transition time, i.e., the time it takes an electronic element to switch between "ON" and "OFF". Even though transition times have decreased to sub-nanosecond figures, with a resultant potential increase in processing rates, the speed with which electronic signals propagate along conductors is fixed by the velocity of light. Thus, physical distances separating circuit elements become increasingly significant, with respect to time, for a signal to go from one point to another in a circuit. Reducing this distance by one-half can, in certain circumstances, actually have the effect of nearly doubling system processing rate.

Thus, processing rates of advanced electronic systems can be limited by sheer physical separation, such as the distances between:

1. distinct passive and active circuit elements, e.g. capacitors, inductors, resistors, semiconductors, etc.;
2. separated functional groups of circuit elements on PC boards; and
3. separated distinct PC boards.

The first of these distances has been reduced by reducing the physical sizes and power requirements of individual circuit elements, and by crowding thousands of such elements of microscopic dimensions on a single IC chip. This solution has become so well known in the art that examples need not be provided.

The second of these distances has been reduced by mounting many IC chips on a single PC board, so arranged that the physical separation between related chips is as small as possible, thus achieving the maximum possible processing rate—or minimum possible processing time—for that association of chips. Again, most modern electronic equipment incorporates this structure, has become well-known in the art, and need not be illustrated here.

Reducing the third of these distances is central to the novelty of the present invention.

Existing solutions to this third problem reduce processing time by packing separated PC boards as tightly together as possible, and typically use sophisticated cooling arrangements to compensate for the heat-buildup caused by the closer physical relationships of the heat-generating elements themselves. Typical of these existing solutions are the following references, all of which are U.S. patents and all of which fall under one or more of the following structures:

1. 'star' or 'asterisk' connection;
2. female connector structures;
3. interconnecting of flat cables; and
4. radial arrangement of PC boards.

1. References to 'Asterisk' Connection Structure

Coe 4,679,872, FIGS. 2 and 10 discloses a 'star' or 'asterisk' connection which is superficially similar to that of the present invention. However, the leads in Coe are self-supporting, relatively massive structures with necessarily large associated stray reactive values, causing unavoidable degradation of electrical signals sent along them, whereas the present invention allows order-of-magnitude reductions of size and of associated reactive values, thus increasing the processing rate of the basic device. (Coe '872 also may be relevant to the radial arrangement of PC boards, below.)

The four Takashima patents (U.S. Pat. Nos. 5,060,111; 5,091,822; 5,210,060, and 5,301,089) all disclose a radial connection system which superfically resembles the soldered or welded connection configuration of the present invention. However, the present invention permits substantially an order of reduction in lead dimension over Takashima, allows access to the common bus in the middle of the structure, and permits a substantial reduction in complexity.

Takashima U.S. Pat. No. 5,301,089 discloses a radial connection system which is a PC configuration, incorporating a radial bus assembly containing a cross-bar switch for distributing signals to the various PC boards. The cross-bar switch of this reference cannot be considered to be analogous to the asterisk connection of the present invention. (Takashima '089 may also be relevant to the PC board arrangement, below.)

2. References to Female Connectors

Heuer U.S. Pat. No. 2,971,179 discloses a female connector for receiving PC boards or flexible flat cables. The structure of the present invention is distinguishable.

Jerominek U.S. Pat. No. 3,737,833 discloses a female connector for use with flexible flat cables. The structure of the present invention is distinguishable.

Roberts et al U.S. Pat. No. 4,740,867 discloses a female connector for connecting a flexible flat ribbon cable to a PC board. The present invention is distinguishable.

Weidler U.S. Pat. No. 4,995,814 discloses a female interconnector for connecting two blade-shaped members such as PC boards, flat cables, or a combination thereof, to each other. The structure of the present invention is distinguishable. (Weidler '814 may also have relevance to interconnecting flat cables, below.)

Dambach et al U.S. Pat. No. 5,194,010, FIG. 3, discloses a female connector for interconnecting flat cables, boards, etc. The structure of the present invention is distinguishable. (Dambach et al '010 may have relevance to interconnecting flat cables, below.)

Frankeny et al U.S. Pat. No. 5,205,740 discloses an interconnector for connecting flat ribbon cables together. It has no relevance to the present invention.

Matschke et al U.S. Pat. No. 5,276,817 discloses an interconnector for connecting PC boards and flat cables together. FIG. 2 thereof is the only portion of this disclosure having even a superficial relevance to the present invention, and is distinguishable.

3. References to Interconnection of Flat Cables

Carter U.S. Pat. No. 3,660,728 discloses a conductor interconnection system for flat cables. It has only a superficial relevance to the present invention and is distinguishable.

Weidler U.S. Pat. No. 4,995,814 discloses an interconnector for two blade-shaped circuit members such as boards, flat cables, or a combination thereof, and is distinguishable from the present invention. (This may have relevance to female connectors, above.)

Dambach et al U.S. Pat. No. 5,194,010, FIG. 3, discloses a connector for interconnecting flat cables, boards, etc., together. Dambach et al is distinguishable from the present invention. (This may also have relevance to female connectors, above.)

Sobhani U.S. Pat. No. 5,213,511 has only a superficial relevance to the present invention, and is distinguishable therefrom.

4. References to Arrangement of PC Boards

Coe U.S. Pat. No. 4,679,872 discloses an arrangement of PC boards around a radial bus assembly. One of the specific purposes of Coe is to reduce the stray capacitances and inductances of high speed circuitry by reducing the length of interconnecting leads (Col. 1, lns 41–58; col. 7, lns. 6–15). However, the present invention is distinguishable.

Takashima U.S. Pat. No. 5,301,089 discloses an arrangement of PC boards around a radial bus assembly which contains a cross-bar switch distributing signals to the various PC boards. A cross-bar switch is not an equivalent of the structure of the present invention.

BRIEF DESCRIPTION OF THE PRESENT INVENTION

The present invention includes a structure for obtaining reduced reflections at a common connection from any of a multiplicity of signal lines having similar characteristic impedances connected to the common connection. When electrical signals, including signals having transition times of substantially less than one nanosecond, are introduced from one of the signal lines into the balance of the lines, reflections at the common connection from discontinuities of any kind in any of the lines are greatly reduced, and do not significantly affect the original signal. For example, when a multiplicity N of signal lines are connected at a common connection and radiate symmetrically from it, and one of the lines is connected to a source of electrical signals of magnitude A amperes feeding N−1 of the lines, reflections at the common connection from any of the N−1 lines will have a magnitude not exceeding.

$$\frac{A}{N-1}.$$

Preferably, the multiplicity of lines radiates symmetrically from the common connection in a planar, or asterisk, fashion, although they could also radiate in a dandelion fashion.

When the asterisk arrangement is used, it is possible to connect the line from the signal source to the common connection orthogonally to the plane, which insures that the stray reactances from the balance of the lines are equally distributed.

This feature alone of the present invention makes possible a performance improvement of up to twenty-fold in processing rates, by reducing the signal path length from PC board to PC board, by equalizing the path lengths, by allowing access to the common bus at other points of a PC board than the input, by minimizing the loading effects of intervening circuitry connected to the signal paths, and by substantially reducing structural complexity.

Another feature of the present invention is a female electrical connector for receiving a thin flat connector such as the edge of a PC board or the end of a flat flexible ribbon cable. The female connector is comprised of two halves which are mirror images of each other. Each half includes a body of two parallel longitudinal members each having a foot end and a head end. Each foot end has a toe portion which extends outwardly from the longitudinal body, and the toe portions of the two halves are abutted to one another to form the connector. The head ends are fabricated into a head member which extends transversely to the head ends of the longitudinal members and to the toe, and the foot ends are fabricated into a foot member which also extends transversely thereto and to the toe, and parallel to the head member. The head member has cantilevered therefrom a resilient arced member which extends toward the foot member substantially parallel to the longitudinal body, with the arced member having a convex surface and a concave surface, and an electrical conductor connected to the convex surface as hereinafter described. With the toe portions of the two halves abutted to one another, the convex surfaces of the arced members face and curve toward one another so that a PC board or a flat flexible ribbon cable end inserted therebetween will force the cantilevered members apart, stressing them and thereby gripping the flat connector between them. The facing surfaces of the resilient arced members may have bonded thereto metallic facings which form the electrical terminals which conductively mate with electrical surfaces on the PC boards and the like. The toe portions act as a stop member to the inserted PC board.

A multi-conductor connector, which will receive a PC board or a multi-conductor flat flexible cable or the like, is formed when the head and foot members are extended transversely with a multiplicity of longitudinal members fabricated herebetween, and cantilevered members extending between each pair of longitudinal members.

A third feature of the present invention is a structure for distributing short rise-time electrical signals, including those having transition times of substantially less than one nanoscond. The structure includes a multiplicity of flat flexible circuit cables having a multiplicity of extended metallic conductors on at least two surfaces. The surfaces are separated from one another by insulation. Each of the cables has thereon a multiplicity of electrically conducting extended conductors or traces, one or more of which end in electrical connectors, which serve to connect the traces to sources of electrical energy, to other electrical elements, as well as to sources of electrical signals having rapid transition times, including sub-nanosecond transition times. Each of the extended traces includes one or more connection points intermediate to the ends thereof, one or more of which have apertures extending between said surfaces of the cables. At least one of the apertures has electrical conductors extending through the cable and conductively connecting to one or more connection points on the other surface of the cable, or to adjacent cables. The multiplicity of cables are held fixed in relationship to each other by clamp blocks, which have affixed thereto one or more connecting electrodes which extend through the apertures, and which provide electrical connection between two or more of the connection points on two or more of the cables.

Yet another feature of the present invention is a novel way of arranging PC boards so as to obtain minimum separation—i.e., maximum packing—and more efficient cooling, and also a novel way of connecting them together so as to obtain maximum processing rates of overall operation. It accomplishes this with minimum deterioration, including 'stretching', of the electrical signals, caused by the loading effects of attaching additional circuits to the signal lines between them.

BRIEF DESCRIPTION OF THE DRAWINGS

FIGS. 3A–C disclose the structure of the female connector feature of the present invention:

FIGS. 3BI–3BIII disclose the structure and operation of the female connector of the present invention:

FIG. 3BI discloses one half of the female connector;

FIG. 3BII discloses the mirror image of 3BI;

FIG. 3BIII discloses both halves of the female connector assembled, with a flat connector inserted therein.

FIGS. 4A–D disclose the structure of a multiplicity of multiple female connectors for receiving a multiplicity of PC boards, connected according to the teachings of the present invention:

FIGS. 5A and 5B disclose the structure of a multiplicity of multi-conductor female connectors which are arranged in a circular or cylindrical arrangement, with INPUT/OUTPUT connectors connected thereto:

DETAILED EXPLANATION OF THE PRESENT INVENTION

Figure 1:
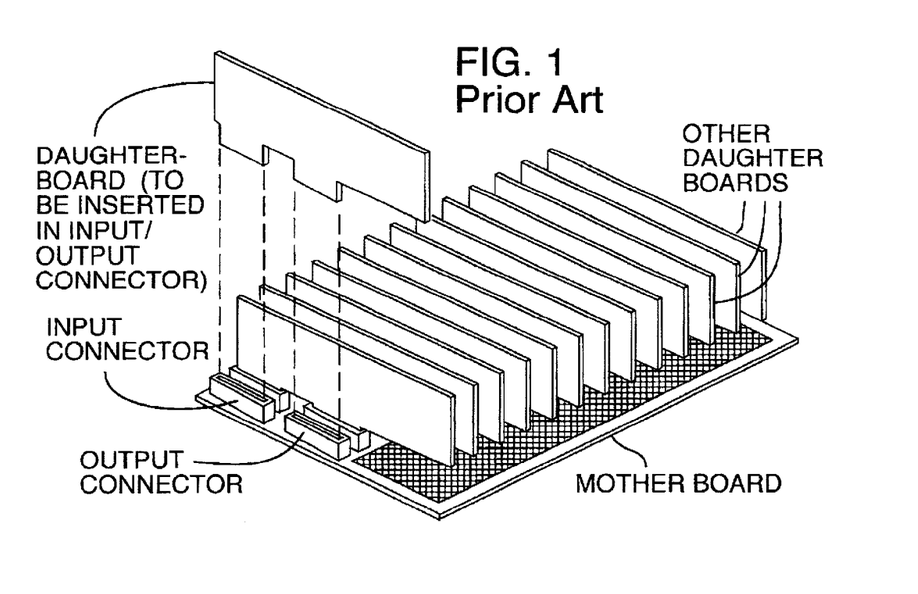
FIG. 1 discloses a typical existing method of the prior art for arranging a multiplicity of PC boards.

FIG. 1 is an illustration of a typical prior art structure for arranging and connecting a multiplicity of PC boards. A master board, or 'motherboard', contains circuitry which controls the interaction between, and operation of, the separate dependent boards, which are called 'daughterboards' (for obvious reasons). The daughterboards interface with the motherboard through two rows of multi-conductor sockets shown thereon, one row of which may be used for signal input, and the other of which may be used for signal output from the daughterboards. The wiring interconnecting the various sockets—and the motherboard control circuitry—will be printed on one or more surfaces (sometimes internal) of the motherboard.

It can be seen from FIG. 1 that some signals may have to go from the output elements of the nearest daughterboard to the input elements of the farthest thereof. The physical separation of these elements on this structure can be nearly 8 ins. (20 cm), with perhaps another 0.6 ins. (1.5 cm) at each end of each signal line to connect through the connectors and onto the PC boards, giving a worst-case signal path length of 9.0 ins. (23 cm). In a typical system, however, a signal must be sent, received and processed at a distant circuit, returned, reacquired and reprocessed at the originating end, so that the initiating circuit will 'know' if further processing of a signal in a particular operating mode is required, or whether it can go on to succeeding modes.

Signals in existing electronic systems, with PC boards of glass-epoxy construction having a dielectric constant of 5.0, travel at rates slightly less than half the speed of light—about 5.3 ins. (13.5 cm) per one-billionth of a second, or nanosecond (nsec)—so this would result in a nearest-to-farthest inter-board travel-time of about 1.7 nsecs each way. The electrical characteristics of the PC boards (in this case, 12 of them) connected between the source and destination of the signal, burden or 'load' it, causing its transition times (risetime and falltime) to 'stretch'. This adds perhaps another 0.5 nsec delay at the end of the signal line each way, as the receiving circuitry waits for the signal to switch to the 'ON' state from the 'OFF' state, or vice versa.

'Rise-time' and 'fall-time' are the times required for a electrical signal to switch between minimum and maximum voltage levels, and vice versa. Propagation delay time each way thus becomes about 2.2 nsec, or 4.4 nsec overall, resulting in a theoretical maximum processing rate of 227 MHZ (megahertz, or millions of cycles per second), even with an impossible allowance of zero time for process-delay times at the receiving ends of the signal path.

The distance between PC boards, then, is seen to impose severe system processing-rate limitations, especially since existing, commercially available, semiconductor devices are available which operate at much greater processing rates than these.

The present invention makes possible a performance improvement of up to twenty-fold in processing rates, by reducing signal path lengths from PC board to PC board and by equalizing them, and by minimizing the loading effects of intervening circuitry connected to the signal paths, and by reducing structural complexity.

A novel method has been discovered for making electrical connections in high processing-rate electrical circuits. This is useful when it is required to connect a number of parallel lines having similar values of controlled impedance, so that any one of these lines may be used as the signal input—the 'SEND' line—feeding the remainder of the lines—the 'RECEIVE' lines. This new method of connection gives little or no practical distortion of the electrical signal at the receiving end of the lines, and actually gives better results as the number of receiving signal paths increases (which is the reverse effect of existing methods of connection of the motherboard/daughterboard arrangements illustrated in FIG. 1).

Figure 2A:
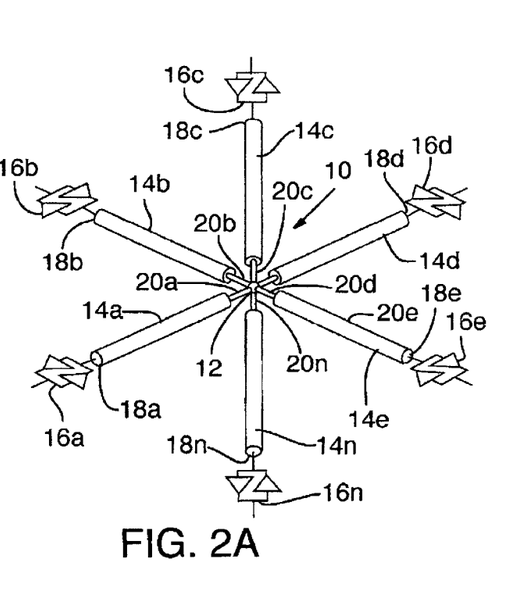
FIG. 2A discloses a 'star' or 'asterisk' structure, the primary structure of the present invention.
Figure 2B:
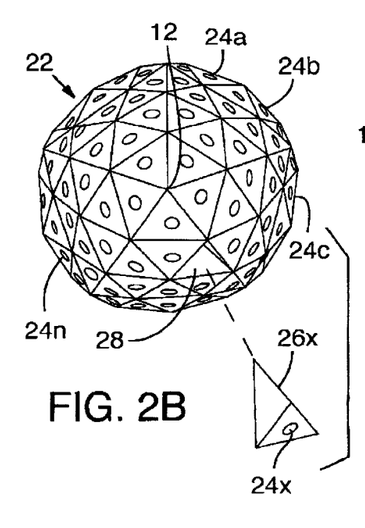
FIG. 2B discloses an alternate, 'dandelion', structure of the present invention.

The basic invention is disclosed in FIGS. 2A and 2B, and is a structural method of making electrical connections for use in electrical circuits, especially high-speed digital circuits for processing electrical signals having very short transition times, i.e., less than one nanosecond. The structure works with slower signals, but is especially effective with very high-speed signals.

It is well known among those skilled in the art that, as transition times decrease of signals processed by electronic circuits, distortion of those signals increases, from a variety of sources, i.e., impedance mismatches and improper terminations, etc. Present invention 10 alleviates that problem in certain situations.

As disclosed in FIG. 2A, present invention 10 is a structure for connecting at a common connection 12 a multiplicity N of signal lines 14a . . . 14n, each having similar characteristic impedances. This structure will greatly reduce, at common point 12, reflections from terminating impedances 16a . . . 16n at far ends 18a . . . 18b of lines 14a . . . 14n, when a current signal of magnitude A having very short transition times is introduced from one of said lines 14a into the balance, 14b. . . 14n, of said lines.

Because present invention 10 is comprised of a multiplicity N of lines 14a . . . 14n having similar characteristic impedances, the signal current provided by any one of lines 14a . . . 14n will divide equally among all lines. Any mismatch of impedances which any one of the signals encounters as it propagates down the lines will cause a reflection to travel back to common connection 12. However, because the signal causing the reflection is only 1/Nth as large as the initial signal, and because impedance-matching terminations are provided at the end of each line 14a . . . 14n, the reflection which will be seen at common connection 12 will be small and, in a digital circuit, will not be sufficient to cause any significant distortion thereof.

The preferred structure of connection 10 is with lines 14a . . . 14n arranged symmetrically in a nominally planar fashion about common connection 12 in a 'star' or 'asterisk' pattern. One of the lines 14a can be used as input in that arrangement, or it could enter axially at common connection 12, orthogonally to the plane of lines 14b . . . 14n, which would insure uniform stray capacitive and inductive reactances for each of the lines 14b . . . 14n and, additionally, would be delayed only by half-network propagation delay-time.

Constructed as disclosed in FIG. 2A and described herein, it has been found that feeding a fast transition electrical signal into a multiplicity N of controlled impedance lines 14b . . . 14n connected in parallel at common connection 12 and arranged symmetrically in planar fashion thereabout, from "SEND"line 14a of similar impedance, will yield relatively undistorted signals on each of said signal lines 14b . . . 14n. Depending on the amount of reflected energy tolerable by SEND line 14a, this planar connection arrangement may work satisfactorily for as few as four lines. Improved performance, i.e., minimal energy reflected back to common connection 12 and source line 14a, is gained as more parallel signal-receiving paths are added, limited only by the driving energy limits of source S, or by the space limitations required by the connection itself.

The structure can be obtained by any of several fabrication techniques. These can range from a simple soldered or welded connection of a multiplicity N of central coaxial conductors 20a . . . 20n arranged symmetrically about common connection 12, to a machined fixture with coaxial connectors incorporating the basic structure therein, and even including a star or asterisk structure fabricated by integrated circuit technology on an IC microchip. Upon reflection, it will be realized by those skilled in the art that signal lead-lengths can be obtained which are extremely short, and that processing rates can be achieved that are as great as twenty times those presently available.

In an alternate three dimensional form 22, as disclose symbolically in FIG. 2B, such an arrangement of a multiplicity of signal lines could accomodate as many conductors as can physically be connected at one point, and might be called a 'dandelion' structure because of the internal structure. Sockets 24a, 24b, 24c . . . 24n, represent connection points for a multiplicity of signal lines, or conductors 20a . . . 20n. Said connection points are electrically connected at common connection 12, by symbolic electrical member 26x, to be inserted into cavity 28.

With appropriate changes in fabrication techniques, the structure would be adaptable to fiber optic technology.

Figures 3, 3B:
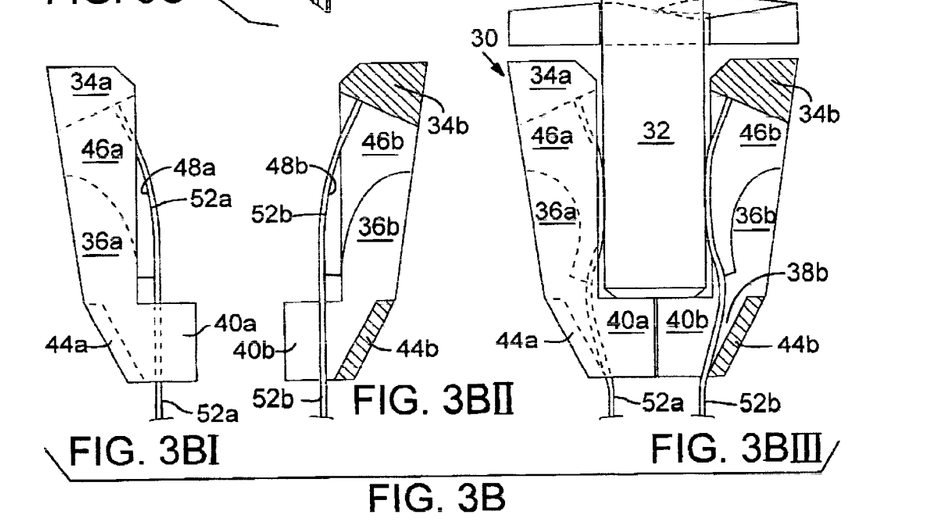
Figures 3A, 3C:
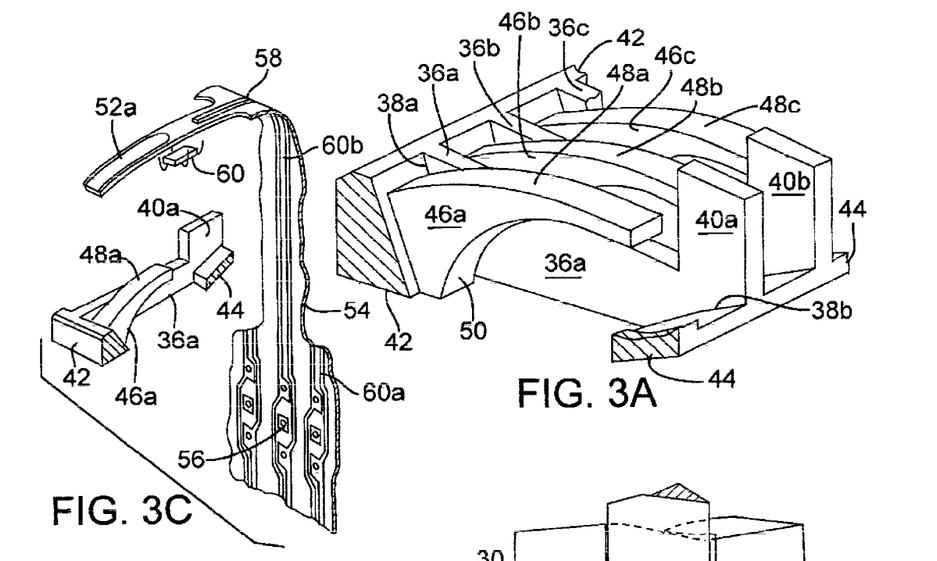
FIG. 3A discloses the structure of one-half of the female connector of the present invention, the other half being a mirror image thereof.
FIG. 3C discloses the structure of the female connector when attaching a finger of a flat flexible ribbon cable thereto.

FIGS. 3A–C disclose another feature of the present invention, female electrical connector 30, for receiving thin flat connector 32, which can be the edge of a PC board or the end of a flat flexible ribbon cable. Female connector 30 is comprised of two halves 34a and 34b, which are mirror images of each other. Each half includes a body of two parallel longitudinal members 36a and 36b, each having head end 38a and foot end 38b. Longitudinal members 36a and 36b have thereon toe portions 40a and 40b, respectively, extending outwardly from foot end 38b. Toe portions 40a and 40b are fixedly abutted to one another to form the complete connector, as disclosed in FIG. 3BIII. Longitudinal members 36a and 36b have fabricated to head ends 38a, head member 42 which extends transversely thereto, and foot ends 38b of members 36a and 36b have fabricated thereto, foot member 44 which also extends transversely to members 36a and 36b and to toes 40a and 40b, both respectively. Head member 42 and foot member 44 are substantially parallel.

Head member 42 has cantilevered therefrom resilient arced members 46a, 46b and 46c which extends toward foot member 44 substantially parallel to longitudinal members 36a and 36b. Arced members 46a, 46b and 46c (both not shown) have thereon convex surfaces 48a, 48b and 48c and concave surfaces 50a, 50b and 50c (both not shown). Electrical conductors are affixed to convex surfaces 48a, 48b and 48c as hereinafter described.

Female connector 30 is formed of longitudinal members 36a and 36b, head member 42 and foot member 44, and arced member 46a cantilevered from head member 42, and a mirror image thereof, as disclosed in FIG. 3BIII. Preferably, each half could be fabricated as a unitary body of a tough resilient plastic material such as RYTON or XYDAR plastics. When toe portions 40a and 40b are fixedly abutted to each other, convex surfaces 48a and 48b of the arced members face and extend toward one another, as disclosed in FIG. 3BIII, so that a thin connector 32, such as a PC board or a flat flexible ribbon cable end, inserted between them, will force cantilevered members 46a and 46b apart, stressing them so that they fixedly grip flat connector 32 therebetween.

Facing surfaces 48a and 48b of resilient arced members 46a and 46b, respectively, will have bonded or otherwise affixed thereto metallic facings which form the electrical terminals which conductively mate with electrical surfaces on thin flat connector 32 and the like. Toe portions 40a and 40b act as a stop member to inserted connector 32.

A multi-conductor connector, which will receive a PC board or a multi-conductor flat flexible cable or the like, is formed when head member 42 and foot member 44 are extended transversely with a multiplicity of longitudinal members 36a and 36b fabricated therebetween. Cantilevered members 46a and 46b will be located between each pair of longitudinal members 36a and 36b.

FIGS. 3BI, 3BII, 3BIII, and 3C disclose how ribbon cable 'fingers' 52a and 52b are bonded to convex surfaces 48a and 48b of cantilever members 46a and 46b, all respectively. Bonding can be done by any method well-known in the art, such as with an epoxy cement, which will give a permanent bond which will withstand repeated insertions and withdrawals.

Cantilevered members 46a and 46b, with ribbon cable fingers 52a and 52b bonded on convex surface 48a and 48b, respectively, form an electrical contact between ribbon cable 54 at terminal 52a and thin member 32. Contact with electrical conductors on other ribbon cables or PC boards is made through connector 56, by means to be described in connection with FIGS. 4A–D, hereinafter.

It will be seen from FIG. 3C that active conductor 58 is connected to terminal 52a by jumper 60, which may contain signal processing electronics. Conductor 58 is balanced on the opposite surface of cable 54 by ground plane conductors 60a and 60b, in accordance with the teaching of U.S. Pat. No. 4,680,557, issued Jul. 24, 1987 to the applicant herein.

FIGS. 4A–4D disclose a structure made possible by the multi-conductor female connector described hereinbefore in connection with FIGS. 3A–3C.

Figure 4A:
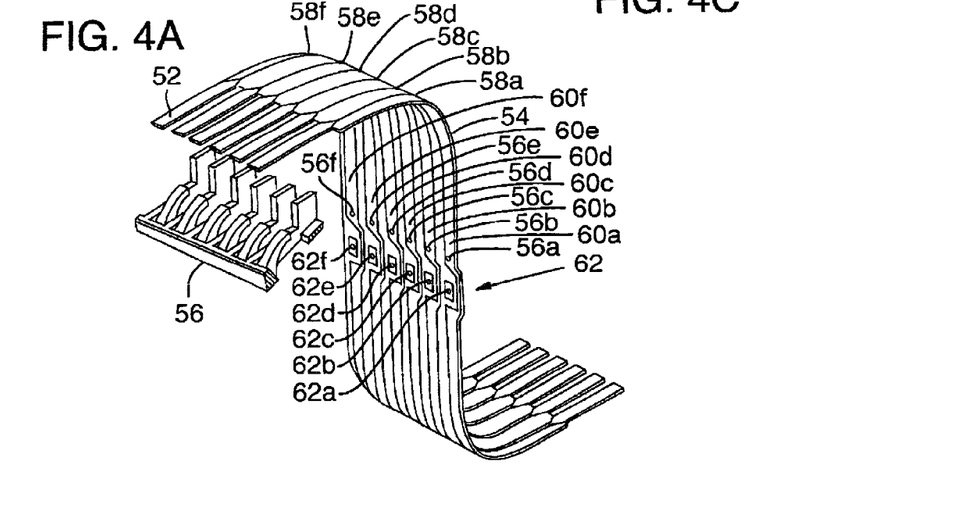
FIG. 4A discloses an exploded view of the structure when attaching a multiplicity of fingers of a flat flexible ribbon cable to a multi-conductor female connector.

FIG. 4A discloses multi-conductor connector 56, attached to prior-art microstrip cable 62, with signal conductors 58a . . . 58f balanced by active power and/or ground conductors 60a . . . 60f.

Figure 4B:
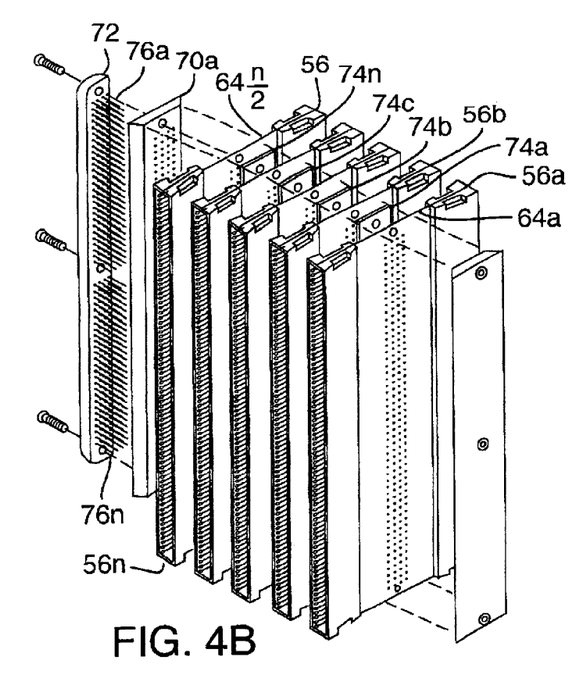
FIG. 4B discloses an exploded view of a pair of connector blocks for clamping together a multiplicity of ribbon cables, each connecting a pair of multi-conductor female connectors according to FIG. 4A.

FIG. 4B discloses an exploded view of a multiplicity of multi-conductor connectors 56a . . . 56n, disclosing the structure of a multi-connector terminal for interconnecting a muliplicity of PC boards. Each multi-conductor connector 56a . . . 56n is connected to another of said connectors by flat flexible ribbon cables 64a . . . 64n, which can be cable 54 of FIG. 3C, or any other existing cable, e.g., prior-art micro-strip cable 62 of FIG. 4A, other flat flexible ribbon cable presently known in the art or which may be developed in the future, or any combination thereof. Insulating separators 74a . . . 74n provide electrical separation between cables 64a . . . 64n, which are pressed together by pressure-blocks 68 and 70, and clamped together by appropriate means. Each of said cables 64a . . . 64n, said insulating separators 74a . . . 74n, and pressure block 70 are perforated by a multiplicity of holes 66a . . . 66n, which are penetrated by a multiplicity of electrically conducting pins 76a . . . 76n, mounted on connector block 72. Pins 76a . . . 76n electrically interconnect with conductors on the opposite faces of said cables 64a . . . 64n, and with selected conductors on other cables, according to the voltage and electrical signal requirements of a particular system. Connector-block 72 may be made interchangable.

Figure 4C:
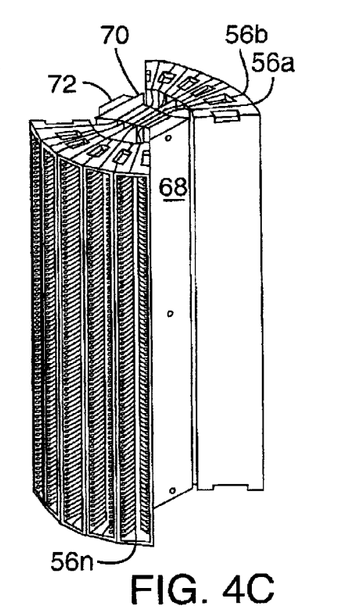
FIG. 4C discloses how a multiplicity of multi-conductor female connectors, as disclosed in FIG. 4A, are clamped together as disclosed in FIG. 4B.

FIG. 4C discloses the assembled structure shown in exploded form in FIG. 4B. Pressure blocks 68 and 70 press cables 64a . . . 64n tightly together, and multi-conductor female connectors 56a . . . 56n fan out radially into a cylindrical form, as shown, ready to receive PC boards.

Figures 4D, 5A:
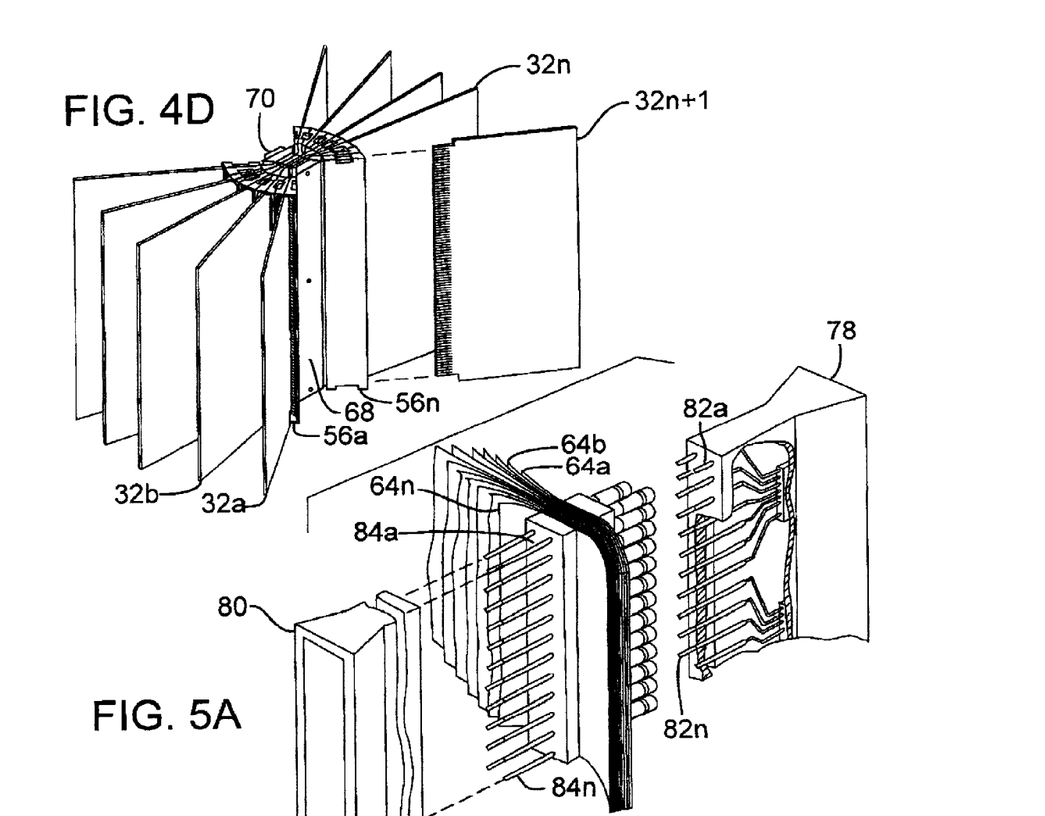
FIG. 4D discloses how edge-terminaled PC boards are inserted in the assembly of FIG. 4C.
FIG. 5A discloses the structure of a multiplicity of flexible ribbon cables having multi-conductor female connectors on the ends thereof which are clamped together and interconnected with a pair of INPUT/OUTPUT connectors.

FIG. 4D discloses PC boards 32a . . . 32n, inserted into connectors 56a . . . 56n, with PC board 32n+1 ready to be inserted into connector 56n+1.

FIG. 5A discloses, in exploded view, another embodiment of FIG. 4D, wherein pressure-blocks 68 and 70, and connector block 72 therein, are replaced by INPUT/OUTPUT (I/O) connector 78 and POWER connector 80. Conductive pins 82a . . . 82n of I/O connector 78, and pins 84a . . . 84n of POWER connector 80, perform the same functions as electrically conducting pins 76a . . . 76n of connector block 72.

Figure 5B:
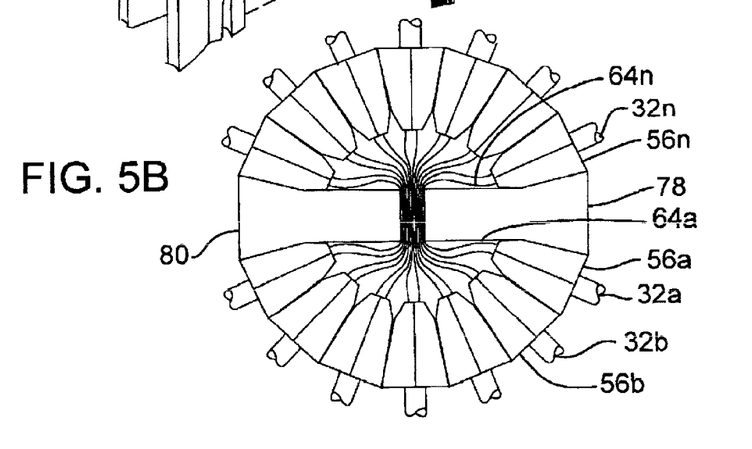
FIG. 5B discloses the structure of an assembled INPUT/OUTPUT structure, including a multiplicity of multiple conductor female connectors, each having a PC board inserted therein, and clamped together with a pair of INPUT/OUTPUT connectors.

FIG. 5B discloses the assembled structure of FIG. 5A, with terminal edges of PC boards 32a . . . 32n inserted into multi-conductor female connectors 56a . . . 56n.

Figure 6:
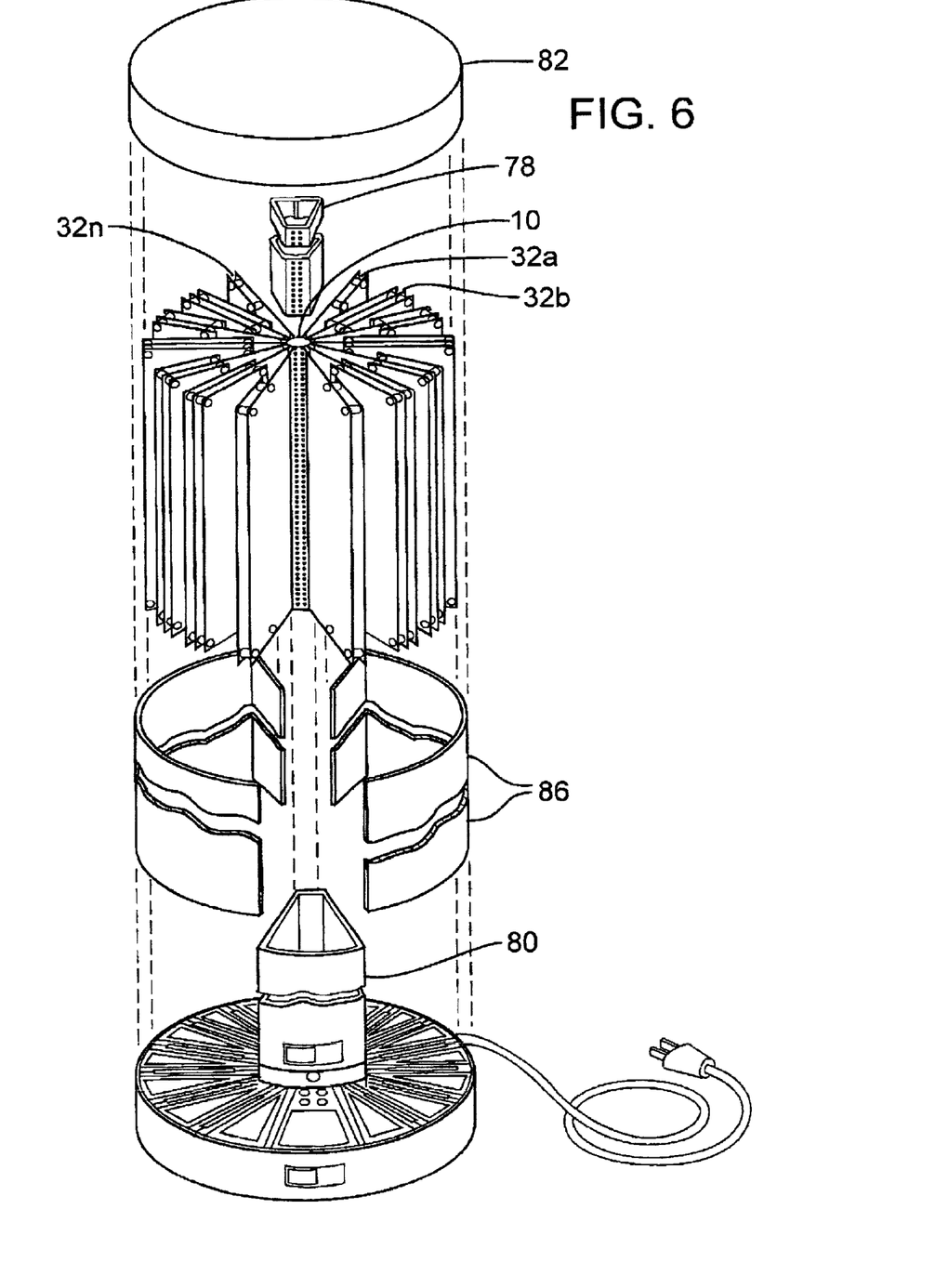
FIG. 6 discloses an assemblage of PC boards, inserted into an assembled INPUT/OUTPUT structure as disclosed in FIG. 5B.

FIG. 6 discloses an assembled multi-board system constructed according to the teachings of the present invention. POWER connector 80 is located at the base, and I/O connector 78 is located at the upper end. PC boards 32a . . . 32n are inserted into multi-conductor female connectors 56a . . . 56n. Multiple star or asterisk connectors 10 are connected at many points internally from the top to the bottom of the structure. Appropriate cooling functions are located in the top 82, and shaped shields direct the flow of air around the temperature-sensitive components on PC boards 32a . . . 32n, to keep the internal temperature within safe, proper operating limits. External shields 86, which can be transparent or opaque, protect the internal components.

The terms and expressions which have been employed in the foregoing specification are used therein as terms of description and not of limitation, and there is no intention, in the use of such terms and expressions, of excluding equivalents of the features shown and described, or portions thereof, it being recognized that the scope of the invention is defined and limited only by the claims which follow.

What I claim as my invention is:

1. A structure for obtaining reduced reflections at a common connection from any of N signal lines, where N equals four or more, said signal lines having similar characteristic impedances, said signal lines connected at said common connection, when an electrical signal having sub-nanosecond transition times, is introduced from one of said lines being connected to a source of electrical signals feeding N−1 of said lines connected into first electrical connectors each receiving therein a mating second electrical connector, COMPRISING:
   a. first electrical connectors having:
      1. a longitudinal body having:
         A. a toe portion extending outwardly therefrom;
         B. a head end including a head member extending transversely to said head end and said toe portion:
            i. said head member having thereon a resilient arced member cantilevered therefrom:
               a). said arced member having a convex surface and a concave surface; and
               b. connected to an electrical conductor;
      c. a foot member extending transversely to both said longitudinal body and said toe portion;
   b. said toe portions of two of said arced members being abutted together with said convex surfaces thereof facing and extending toward one another to grippingly receive a second mating electrical connector therebetween.

2. A structure for obtaining reduced reflections at a common connection from any of N signal lines, where N equals four or more, said signal lines having similar characteristic impedances, said reflections at said common connection from any of N−1 lines having a magnitude not exceeding $$\frac{A}{N-1}$$

when an electrical signal of magnitude of A amperes having sub-nanosecond transition times is introduced from one of said lines and feeding said N−1 thereof, and connected into first electrical connectors each receiving therein a mating second electrical connector, COMPRISING:
 a. first electrical connectors having:
  1. a longitudinal body having:
   A. a toe portion extending outwardly therefrom;
   B. a head end including a head member extending transversely to said head end and said toe portion:
    i. said head member having thereon a resilient arced member cantilevered therefrom:
    a). said arced member having a convex surface and a concave surface; and
    b. connected to an electrical conductor;
  c. a foot member extending transversely to both said longitudinal body and said toe portion;
 b. said toe portions of two of said arced members being abutted together with said convex surfaces thereof facing and extending toward one another to grippingly receive a second mating electrical connector therebetween.

3. A structure for obtaining reduced reflections at a common connection from any of a multiplicity of signal cables connected thereto, SAID STRUCTURE COMPRISING:
 a. a multiplicity N of four or more signal cables having similar characteristic impedances fixedly connected at a common connection and radiating therefrom;
 b. one of said cables:
  1. being connected to a source of electrical pulsess having sub-nanosecond transition times; and
  2. feeding said pulses to the balance N−1 of said cables.

4. A structure for obtaining reduced reflections at a common connection from any of a multiplicity of signal cables connected thereto, SAID STRUCTURE COMPRISING:
 a. a multiplicity N of four or more signal cables having similar characteristic impedances connected at a common connection and radiating therefrom;
 b. one of said cables:
  1. being connected to a source of electrical pulses having:
   A. sub-nanosecond transition times; and
   B. a magnitude of A amperes; and
  2. feeding N−1 of said cables;
 c. reflections at said common connection from any of said N−1 cables having a magnitude not exceeding $$\frac{A}{N-1}.$$

5. The structure of claim 3 or 4, wherein said multiplicity of said cables radiates symmetrically from said common connection.

6. The structure of claim 3 or 4, wherein said multiplicity of said cables radiates symmetrically in a plane from said common connection.

7. A structure for obtaining reduced reflections at a common connection from a multiplicity N−1 of signal cables, where N is equal to four or more, when an electrical pulse is introduced from one of said cables to said N−1 cables thereof, said signal cables having similar characteristic impedances and being connected to said common connection, and radiating therefrom, wherein each of said cables is connected into a flat flexible circuit cable, SAID STRUCTURE COMPRISING:
 a. a flat flexible circuit cable:
  1. having thereon two surfaces; and
  2. being placed adjacent to one or more other said flat flexible circuit cables:
 b. the surfaces of said flat flexible circuit cables being separated from one another by insulation:
  1. each of said flat flexible circuit cables having thereon a multiplicity of extended electrical conductors:
   A. one or more of said conductors ending in electrical connectors for connecting said conductors to:
    i. sources of electrical energy;
    ii. sources of digital current pulses having sub-nanosecond transition times; and
    iii. other electrical elements;
   B. each of said extended conductors including one or more connection points thereon, one or more of which have apertures extending between said surfaces of said flat flexible circuit cables:
    i. said apertures having extending therethrough electrodes connecting with one or more connection points on adjacent flat flexible circuit cables;
 c. said multiplicity of flat flexible circuit cables being held in fixed relationship to each other by clamp blocks:
  1. having affixed thereto one or more of said connecting electrodes:
   A. extending through said apertures, and
   B. providing electrical connections between two or more of said connection points on two or more of said flat flexible circuit cables.

8. A structure for obtaining reduced reflections at a common connection from any of a multiplicity N−1 of signal cables, where N is equal to four or more, when an electrical pulse is introduced from a signal cable to said N−1 signal cables, all signal cables having similar characteristic impedances connected at said common connection and radiating therefrom, said electrical pulse having a magnitude of A amperes, said reduced reflections from any of said N−1 cables having a magnitude not exceeding $$\frac{A}{N-1},$$

said N cables connected into a multiplicity of circuit cables, SAID STRUCTURE COMPRISING:
 a. flat flexible circuit cables:
  1. having thereon two surfaces; and
  2. being placed adjacent to one or more other said flat flexible circuit cables:
 b. the surfaces of said flat flexible circuit cables being separated from one another by insulating members;
  1. each of said flat flexible circuit cables having thereon a multiplicity of electrically conducting extended conductors:

A. one or more of said conductors ending in electrical connectors for for connecting said conductors to:
  i. sources of electrical energy;
  ii. sources of digital current pulses having subnanosecond transition times; and
  iii. other electrical elements;
B. each of said extended conductors including one or more connection points thereon, one or more of which have apertures extending between said surfaces of said flat flexible circuit cables:
  i. said apertures having extending therethrough connecting electrodes connecting with one or more connection points on adjacent flat flexible circuit cables;
c. said multiplicity of flat flexible circuit cables being held in fixed relationship to each other by clamp blocks:
  1. having affixed thereto one or more of said connecting electrodes:
    A. extending through said apertures, and
    B. providing electrical connections between two or more of said connection points on two or more of said flat flexible circuit cables.

9. A structure of N signal cables having similar characteristic impedances connected at a common connection, where N is equal to four or more, one of said N cables being connected to a source of electrical pulses and N−1 of said cables being connected into first electrical connectors each receiving therein a mating second electrical connector, SAID STRUCTURE COMPRISING:
  a. said electrical pulses from said source having subnanosecond transition times;
  b. said first electrical connectors having:
    1. a longitudinal body having:
      A. a toe portion extending outwardly therefrom;
      B. a head end including a head member extending transversely to said head end and said toe portion:
        i. said head member having thereon a resilient arced member cantilevered therefrom:
          a). said arced member having a convex surface and a concave surface; and
          b). connected to an electrical conductor;
    c. a foot member extending transversely to both said longitudinal body and said toe portion;
  c. said toe portions of two of said arced members being abutted together with said convex surfaces thereof facing and extending toward one another to grippingly receive said second mating electrical connector therebetween.

10. A structure of N signal cables having similar characteristic impedances connected at a common connection, where N is equal to four or more, one of said N cables being connected to a source of electrical pulses and N−1 of said cables being connected into first electrical connectors each receiving therein a mating second electrical connector, SAID STRUCTURE COMPRISING:
  a. said pulses from said source having a magnitude of A amperes and subnanosecond transition times;
  b. reflections at said common connection from any of said N−1 of said cables having a magnitude of less than $$\frac{A}{N-1}$$

amperes;
  c. said first electrical connectors having:
    1. a longitudinal body having:
      A. a toe portion extending outwardly therefrom;
      B. a head end including a head member extending transversely to said head end and said toe portion:
        i. said head member having thereon a resilient arced member cantilevered therefrom:
          a). said arced member having a convex surface and a concave surface; and
          b). connected to an electrical conductor;
    c. a foot member extending transversely to both said longitudinal body and said toe portion;
  d. said toe portions of two of said arced members being abutted together with said convex surfaces thereof facing and extending toward one another to grippingly receive said second mating electrical connector therebetween.

* * * * *